United States Patent
Kim et al.

(10) Patent No.: US 8,686,531 B2
(45) Date of Patent: Apr. 1, 2014

(54) STRUCTURE AND METHOD FOR FORMING A GUARD RING TO PROTECT A CONTROL DEVICE IN A POWER SEMICONDUCTOR IC

(75) Inventors: Wooseok Kim, Gyeonggi-do (KR); Kyoungmin Lee, Seoul (KR)

(73) Assignee: Fairchild Korea Semiconductor, Ltd., Dodang-dong, Wonmi-ku, Puchon, Kyungki-do (KR)

(*) Notice: Subject to any disclaimer, the term of this patent is extended or adjusted under 35 U.S.C. 154(b) by 833 days.

(21) Appl. No.: 12/273,424

(22) Filed: Nov. 18, 2008

(65) Prior Publication Data
US 2009/0127660 A1 May 21, 2009

(30) Foreign Application Priority Data
Nov. 19, 2007 (KR) .................. 10-2007-0118083

(51) Int. Cl.
*H01L 29/06* (2006.01)
(52) U.S. Cl.
USPC .................. 257/494; 257/409; 257/E29.013
(58) Field of Classification Search
None
See application file for complete search history.

(56) References Cited

U.S. PATENT DOCUMENTS

| | | | |
|---|---|---|---|
| 3,931,634 A | 1/1976 | Knight | |
| 4,905,067 A | 2/1990 | Morelli et al. | |
| 5,021,860 A | 6/1991 | Bertotti et al. | |
| 5,545,917 A | 8/1996 | Peppiette et al. | |
| 5,753,964 A | 5/1998 | Yashita et al. | |
| 5,973,366 A * | 10/1999 | Tada | 257/354 |
| 6,759,728 B1 * | 7/2004 | Pidutti | 257/532 |
| 6,831,331 B2 * | 12/2004 | Kitamura et al. | 257/343 |
| 7,420,260 B2 * | 9/2008 | Kwon et al. | 257/547 |
| 2003/0071314 A1 * | 4/2003 | Jang et al. | 257/371 |
| 2003/0228737 A1 * | 12/2003 | Efland et al. | 438/382 |
| 2004/0004263 A1 * | 1/2004 | Rothleitner | 257/500 |
| 2005/0073007 A1 * | 4/2005 | Chen et al. | 257/355 |
| 2005/0179093 A1 | 8/2005 | Morris | |
| 2007/0057321 A1 * | 3/2007 | Kikuchi et al. | 257/327 |
| 2007/0132008 A1 * | 6/2007 | Kang et al. | 257/316 |

FOREIGN PATENT DOCUMENTS

KR 10-2007-0030142 A 3/2007

* cited by examiner

*Primary Examiner* — Benjamin Sandvik
(74) *Attorney, Agent, or Firm* — Kenneth E. Horton; Kirton McConkie

(57) ABSTRACT

Provided is a power semiconductor device including a guard ring region to protect control devices. The power semiconductor device includes a semiconductor body layer extending over a semiconductor substrate of a first conductivity type. The semiconductor body layer has a second conductivity type opposite the first conductivity type. A well of the first conductivity type extends in the semiconductor body layer and is configured to be electrically insulated from the semiconductor substrate. At least one control device is formed in the well, where the control device comprises at least one of PN junction. A guard ring region of the first conductivity type is laterally spaced from but surrounds the well. The guard ring region together with the semiconductor substrate and the semiconductor body layer form a parasitic bipolar transistor, and the guard ring region functions as a collector of the parasitic bipolar transistor.

27 Claims, 3 Drawing Sheets

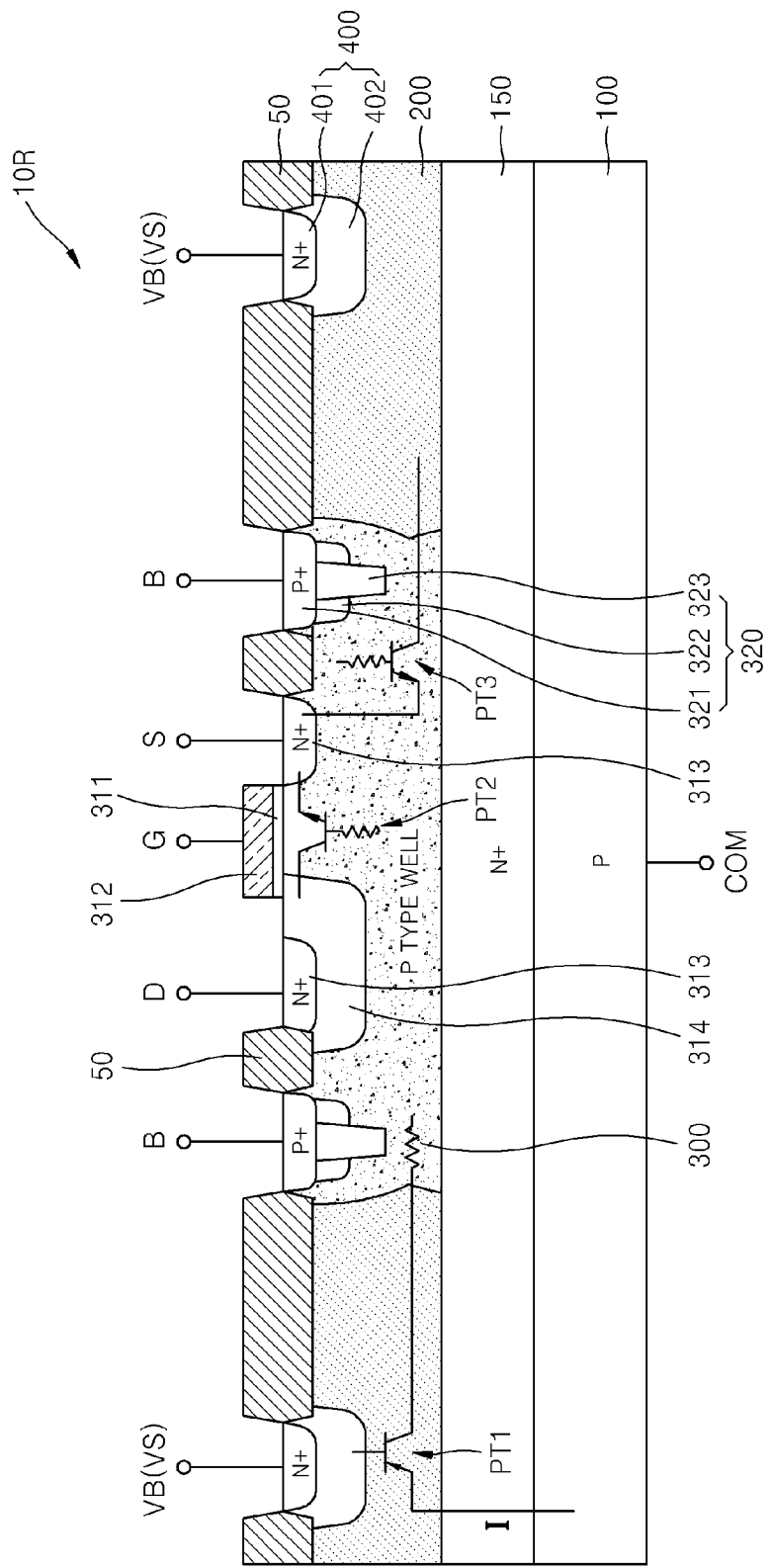

STRUCTURE AND METHOD FOR FORMING A GUARD RING TO PROTECT A CONTROL DEVICE IN A POWER SEMICONDUCTOR IC

CROSS-REFERENCES TO RELATED APPLICATIONS

This application claims priority to Korean Application No. 10-2007-0118083, filed Nov. 19, 2007, which is incorporated herein by reference in its entirety for all purposes.

BACKGROUND OF THE INVENTION

The present invention relates to a power semiconductor device, and more particularly, to a structure and method for forming a power semiconductor device including a guard ring region to protect a control device.

In semiconductor integrated circuit (IC) having a plurality of devices monolithically integrated in a single semiconductor substrate, unwanted parasitic elements such as transistors, diodes, or resistors, may cause problems such as cross-talk or latch-up. Where power semiconductor devices are monolithically integrated in a p-type semiconductor substrate, a parasitic PNP bipolar transistor may be formed by the p-type semiconductor substrate, an n-type layer and a p-type region in the n-type layer. The parasitic PNP bipolar transistor may be turned on when one of the PN junctions of the bipolar transistor is forward-biased, and may cause latch-up or permanent damage to the device. Also, leakage currents, including current caused by the parasitic PNP bipolar transistor, may increase the potential of the p-type region due to resistivity of the p-type region, thereby turning other parasitic NPN bipolar transistors on.

An example of the above semiconductor circuit is a power semiconductor device in which a high-power driving device for driving a power element such as a motor, and a low-power control device for controlling the high-power driving device are integrated in a single semiconductor substrate. Such semiconductor device is also referred to as a smart integrated circuit, and provides advantages of superior performance, cost-saving, and improvement in the reliability of the device. In such smart integrated circuit, conditions for generating a forward voltage turning on a parasitic element often arise due to instantaneous voltages induced during switching an inductive power element such as a motor. As indicated above, when these parasitic elements are turned on, latch-up or other undesirable problems can occur. Therefore, there is a need for techniques that address problems caused by such parasitic elements.

BRIEF SUMMARY OF THE INVENTION

Embodiments of the present invention, among other advantages and features, prevent such problems as latch-up or breakdown caused by parasitic elements when driving an inductive power element.

According to an aspect of the present invention, there is provided a power semiconductor device which includes a semiconductor body layer extending over a semiconductor substrate of a first conductivity type. The semiconductor body layer has a second conductivity type opposite the first conductivity type. A well of the first conductivity type extends in the semiconductor body layer and is configured to be electrically insulated from the semiconductor substrate. At least one control device is formed in the well, where the control device comprises at least one of PN junction. A guard ring region of the first conductivity type extends in the semiconductor body layer and is laterally spaced from but surrounds the well. The guard ring region together with the semiconductor substrate and the semiconductor body layer form a parasitic bipolar transistor where the guard ring region functions as a collector of the parasitic bipolar transistor.

According to another aspect of the present invention, there is provided a power semiconductor device which includes a semiconductor body layer extending over a semiconductor substrate of a first conductivity type. The semiconductor body layer has a second conductivity type opposite the first conductivity type. A first well of the first conductivity type extends in the semiconductor body layer. At least one transistor is formed in the first well. A first electrode region extends in the semiconductor body layer such that the first electrode region is laterally spaced from the first well. The first electrode region is electrically connected to a first power source for biasing the semiconductor body layer. A guard ring region of the first conductivity type includes a second well of the first conductivity type. The guard ring region is disposed between the first electrode region and the first well and surrounds the first well. A second electrode region extends in the second well and is electrically connected to a second power source for biasing the guard ring. The first and second power sources are different from one another.

In some embodiments of the present invention, the first conductivity type may be P type, the second conductivity type may be N type, and the at least one transistor in the first well may be an n-channel MOSFET. Also, one of the first power source and the second power source may be electrically connected to a reference node of an external circuit. Additionally, the power semiconductor device may further include a bulk electrode region of the first conductivity type which extends in the first well, wherein the bulk electrode region is laterally spaced from the at least one transistor and is electrically connected to a third power source for biasing the second well.

BRIEF DESCRIPTION OF THE DRAWINGS

The above and other features and advantages of the present invention will become more apparent by describing in detail exemplary embodiments thereof with reference to the attached drawings in which:

FIG. 3 is a cross-sectional view of a power semiconductor device where a guard ring region is omitted.

DETAILED DESCRIPTION OF THE INVENTION

Figure 1:
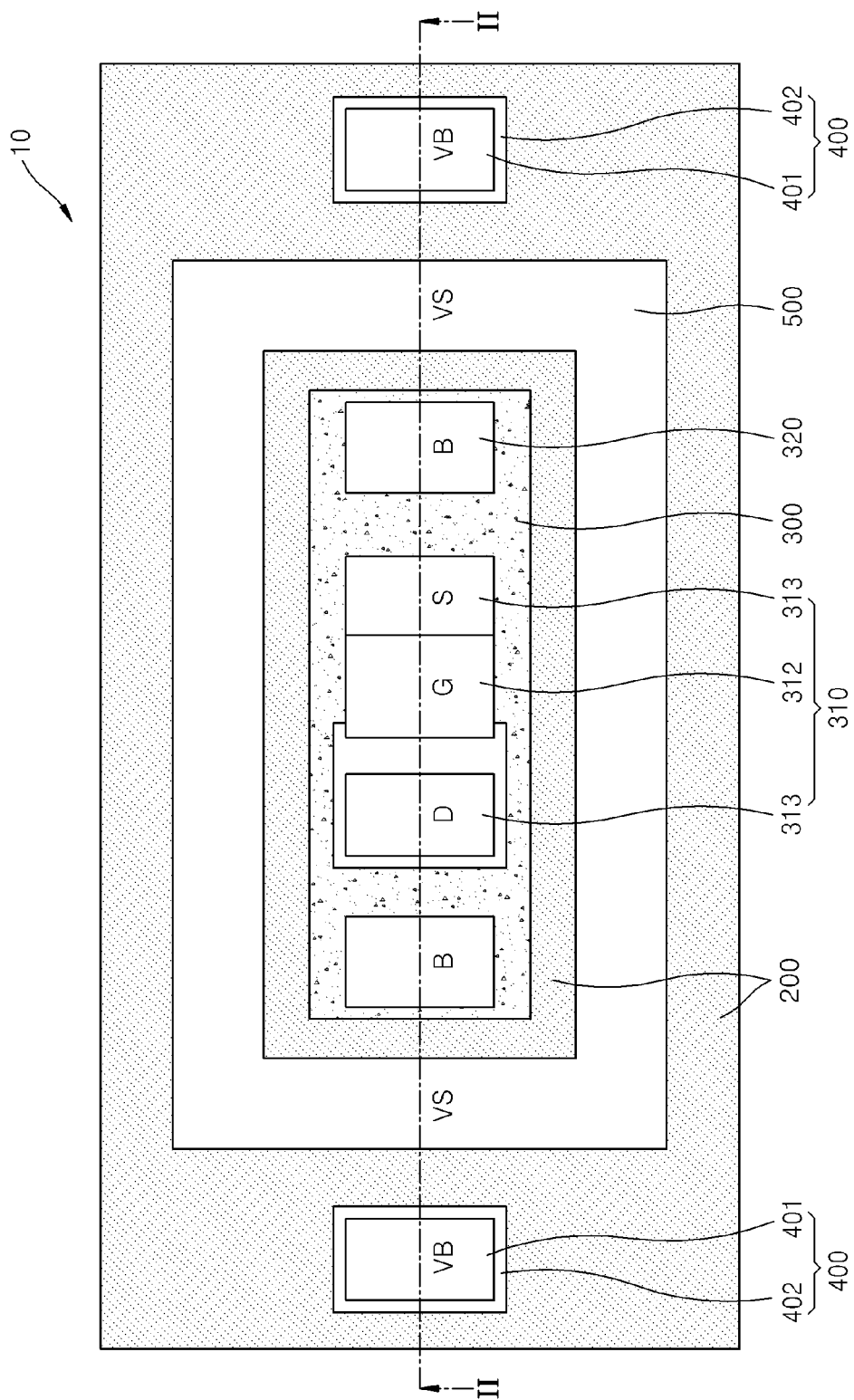
FIG. 1 is a top view of a power semiconductor device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
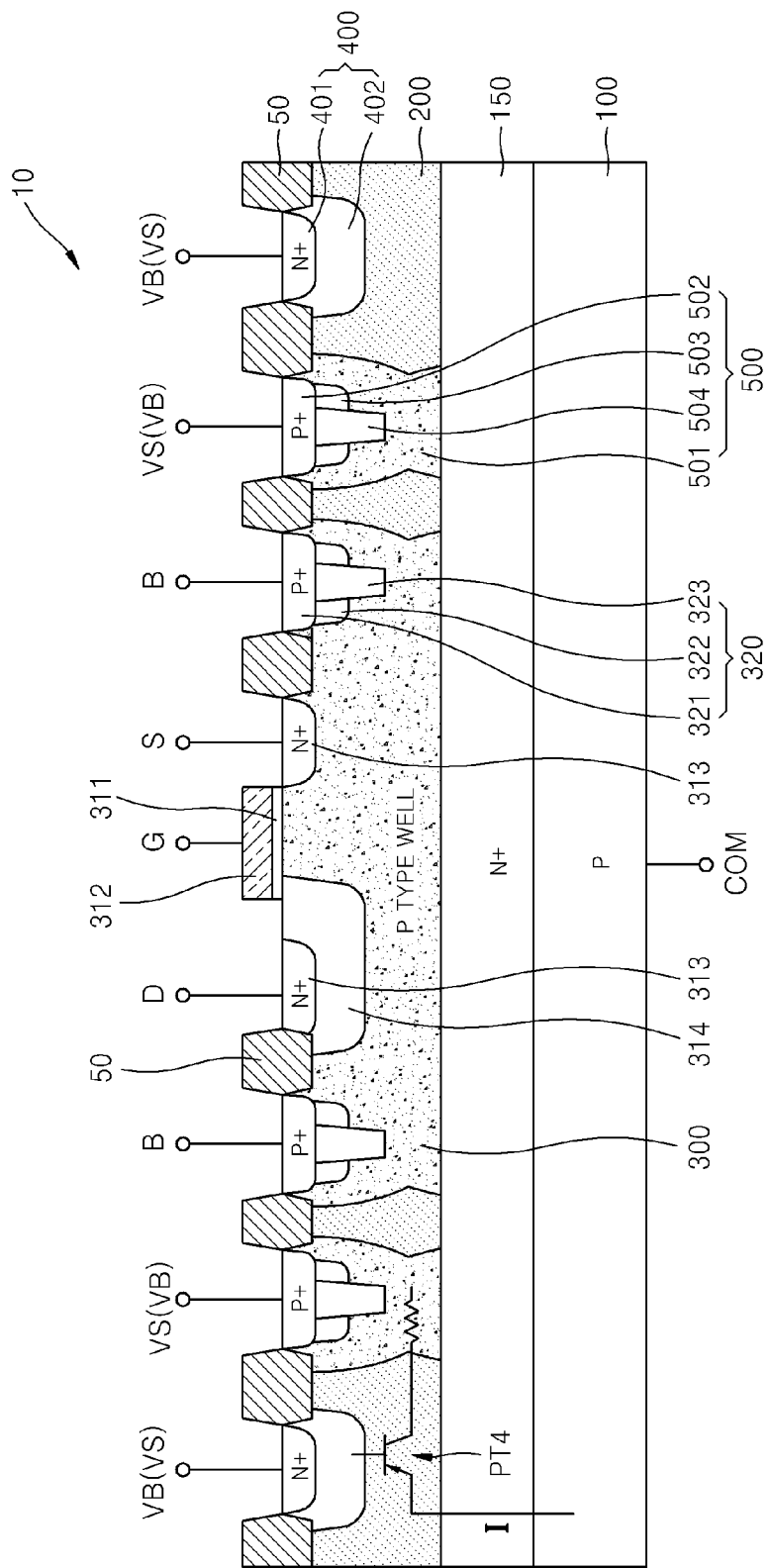
FIG. 2 is a cross-sectional view of the power semiconductor device of FIG. 1, taken along line II-II.

FIG. 1 is a top layout view of a power semiconductor device 10 according to an embodiment of the present invention, and FIG. 2 is a cross-sectional view of the power semiconductor device 10 taken along line II-II of FIG. 1. Isolation regions 50 shown in FIG. 2 are omitted in FIG. 1 for clarity.

Referring to FIGS. 1 and 2, power semiconductor device 10 includes a first conductivity type, for example, p type, semiconductor substrate 100 and a second conductivity type, for example, n type, semiconductor body layer 200 formed over semiconductor substrate 100 using known process techniques. Semiconductor body layer 200 may be an epitaxial layer. One or more first wells 300 of the first conductivity type are formed in semiconductor body layer 200 using conventional process techniques, and one or more transistors 310 are formed as control devices in first well 300 in accordance with known process methods.

Transistor 310 may be an n-channel metal-oxide-semiconductor field-effect transistor (MOSFET) which includes a source S, a drain D, and a gate G. Gate G includes gate insulation layer 311 and gate electrode 312 both formed on semiconductor body layer 200 using conventional processing techniques. Drain D and source S may include high-concentration impurity regions 313 in an upper portion of semiconductor body layer 200 with gate G therebetween. As commonly understood by those skilled in the art, drain D and source S may be denoted conversely as source S and drain D, respectively. Drain D may further include a low-concentration impurity region 314 of the second conductivity type which may surround the corresponding high-concentration impurity regions 313 and extend toward a channel region and below gate D, as shown in FIG. 2. Low-concentration impurity region 314 can prevent trapping effect of hot electrons and improve the breakdown characteristics of transistors 310 by lowering an electric field concentrated near the high-concentration impurity region 313 that low-concentration impurity region 314 surrounds.

Bulk electrode regions 320 of the first conductivity type for biasing first well 300 may be formed using known process techniques. Bulk electrode regions 320 may be laterally separated from transistor 310 by isolation regions 50. Bulk electrode regions 320 may include first conductivity type high-concentration impurity regions 321 formed in an upper portion of first well 300, and first conductivity type low-concentration impurity region 322 formed below high-concentration impurity regions 321 using conventional processes. In some embodiments of the present invention, bulk electrode regions 320 may further include first conductivity type deep impurity regions 323 which extend from high-concentration impurity regions 321 toward semiconductor substrate 100 through low-concentration impurity regions 322. Source S of transistor 310 and terminal B of bulk electrode regions 320 may be electrically connected together via a conductor (not shown).

First electrode regions 400 of the second conductivity type, laterally spaced from first well 300, are formed in semiconductor body layer 200 using known process techniques. First electrode regions 400 may be electrically connected to a power terminal VB of a power element such as a motor, if power semiconductor device 10 is implemented in a high side region of a power circuit. However, this is merely an example, and first electrode region 400 according to an alternate embodiment of the present invention may be electrically connected to a voltage sync terminal VS of the power element, if power semiconductor device 10 is implemented in a low side region of a power circuit. First electrode region 400 may include a second conductivity type high-concentration impurity region 401 of the second conductivity type for a contact, and may further include a low-concentration impurity region 402 of the second conductivity type surrounding the high-concentration impurity region 401.

Power semiconductor device 10 further includes a guard ring region 500 of the first conductivity type formed between first well 300 and first electrode region 400 using conventional process techniques. As can be seen in the top layout view in FIG. 1, guard ring region 500 completely surrounds first well 300 along the lateral dimension. Guard ring region 500 may be electrically connected to a reference node of an external circuit so as to provide the voltage sync VS. However, the embodiments of the present invention are not limited thereto, and first electrode region 400 may be electrically connected to voltage sync terminal VS of the external circuit while guard ring region 500 may be electrically connected to power terminal VB of the external circuit. Alternatively, guard ring region 500 may be electrically biased to a voltage between VB and VS or some other voltage.

Guard ring region 500 includes a second well 501 of the first conductivity types that may be formed at the same time that first well 300 is formed. Guard ring region 500 further includes a high-concentration impurity region 502 of the first conductivity type for contacts on a top surface of second well 501. In some embodiments of the present invention, guard ring region 500 may further include a low-concentration impurity region 503 of the first conductivity type extending below high-concentration impurity region 502. Low-concentration impurity region 503 may have an impurity concentration lower than that of high-concentration impurity region 502 and higher than that of second well 501. Low-concentration impurity region 503 of guard ring region 500 lowers an otherwise high electric field caused by differences in the impurity concentrations, and thus the breakdown voltage is improved. Also, guard ring region 500 may further include deep impurity regions 504 of the first conductivity type extending from high-concentration impurity regions 502 toward semiconductor substrate 100 through low-concentration impurity regions 503. Impurity concentration of deep impurity regions 504 may be substantially equal to that of high-concentration impurity region 502.

Power semiconductor device 10 may further include a buried layer 150 between semiconductor body layer 200 and semiconductor substrate 100 to electrically isolate semiconductor body layer 200 and semiconductor substrate 100. Buried layer 150 may be a second conductivity type high-concentration impurity layer which can separate semiconductor substrate 100 and semiconductor body layer 200 and thus serve as a junction isolation. As shown in FIG. 2, buried layer 150 may be formed to fully cover semiconductor substrate 100. Optionally, buried layer 150 may be partially formed only below first well 300 so as to isolate transistor 310 from semiconductor substrate 100, or extend from below first well 300 to below guard ring region 500. Buried layer 150 may be formed in a lower portion of an epitaxial layer that also includes semiconductor body layer 200 (e.g., by implanting dopants deep into the epitaxial layer). Alternatively, buried layer 150 may be formed by implanting into substrate 100. In yet another embodiment, buried layer 150 may be an epitaxial layer formed separately from semiconductor body layer 200.

When first well 300 and semiconductor substrate 100 are electrically isolated, operating voltages different from each other can be applied thereto, respectively. For example, semiconductor substrate 100 may be connected to a common electrode terminal COM of an external circuit having a reference voltage, which may be, for example, 0V. With first well 300 and guard ring region 500 in direct contact with buried layer 150 so as to form PN junctions therebetween, and with guard ring region 500 laterally isolating first well 300 from first electrode regions 400, it is possible to substantially block a parasitic electric current generated by a first PNP parasitic bipolar transistor (PT1 of FIG. 3) from flowing through first well 300, as described next.

Hereinafter, a mechanism by which guard ring region 500 protects transistor 310 in first well 300 according to an embodiment of the present invention will be described with reference to FIGS. 2 and 3. FIG. 3 also shows a power semiconductor device 10R without a guard ring region as a comparative example.

When a current supplied to a inductive power element, such as a motor, is suddenly interrupted during the operation of the inductive power element, power voltage VB may become momentarily smaller than a voltage of common electrode COM, and a current I is supplied from p-type substrate 100 to n-type semiconductor body layer 200. As shown in FIG. 3, current I flowing from semiconductor substrate 100 turns on a first parasitic PNP bipolar transistor PT1 comprised of p-type semiconductor substrate 100, n-type first electrode region 200, and p-type first well 300, and a current Ic leaks to first well 300 functioning as a collector of first PNP bipolar transistor PT1. Current Ic may undesirably increase an electric potential of first well 300 due to the resistivity of first well 300.

If the potential of first well 300 is sufficiently increased by current Ic from the first parasitic bipolar transistor PT1, a secondary parasitic NPN bipolar transistor PT2 comprised of n-type drain D, p-type first well 300, and n-type source S may be turned on. Other secondary parasitic devices such as a third parasitic NPN bipolar transistor PT3 comprised of n-type source S, p-type first well 300, and n-type semiconductor body layer 200 may also be turned on as the second NPN bipolar transistor PT2 is turned on. The parasitic currents flowing as a result of one or more of the parasitic bipolar transistors PT1, PT2, and PT3 turning on can cause transistor 310 to malfunction or result in latch-up.

Referring back again to FIG. 2, if power voltage VB becomes momentarily smaller than the voltage of common electrode COM, a fourth parasitic PNP bipolar transistor PT4 comprised of p-type semiconductor substrate 100, n-type first electrode region 400, and p-type guard ring region 500 is turned on. While for first parasitic bipolar transistor PT1 illustrated in FIG. 3, p-type first well 300 functions as a collector of first parasitic bipolar transistor PT1, guard ring region 500 functions as a collector of fourth PNP bipolar transistor PT4, and thus no current leaks to p-type first well 300. As a result, unlike the case shown in FIG. 3, the potential of first well 300 does not increase even when current I flows from semiconductor substrate 100 to semiconductor body layer 200. Therefore, second and third parasitic NPN bipolar transistors PT2 and PT3 shown in FIG. 3 are not turned on, and thus transistor 310 can function normally. Stated otherwise, a substantial amount of current I generated by parasitic bipolar transistor PT4 is diverted through guard ring 500 thus preventing current I from reaching first well 300. Without any parasitic currents flowing through first well 300, none of the PN junctions in first well 300 are forward biased, and thus parasitic transistors PT2 and PT3 are not turned on. Therefore, guard ring region 500 ensures stable operation of transistor 310.

Although the invention is described using power semiconductor device 10 with a transistor 310 disposed in first well 300, the scope of the present invention is not limited thereto. For example, guard ring region 500 configured to suppress latch-up effect and/or prevent parasitic transistors from turning on can provide the same effect for other control devices implemented with other devices having different types of junctions within first well 300. For example, a diode having a PN junction may be disposed in first well 300 as a control device instead of or in conjunction with a transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power semiconductor device comprising:
   a semiconductor body layer extending over a semiconductor substrate of a first conductivity type, the semiconductor body layer having a second conductivity type opposite the first conductivity type;
   a well of the first conductivity type extending in the semiconductor body layer and configured to be electrically insulated from the semiconductor substrate;
   at least one transistor formed in the well, the transistor comprising a source, drain, and a gate, the source comprising a first high-concentration impurity region formed in the well and the drain comprising a second high-concentration impurity region formed in the well; and
   a guard ring region of the first conductivity type surrounding the well but laterally separated from the well by the semiconductor body layer,
   wherein the guard ring region together with the semiconductor substrate and the semiconductor body layer form a parasitic bipolar transistor, and the guard ring region functions as a collector of the parasitic bipolar transistor.

2. The power semiconductor device of claim 1 further comprising a first electrode region of the second conductivity type extending in the semiconductor body layer, the first electrode region being capable of receiving a first supply voltage provided by a first power source for biasing the semiconductor body layer.

3. The power semiconductor device of claim 2 wherein the guard ring extends between the well and the first electrode region so as to laterally isolate the well and the first electrode region from one another.

4. The power semiconductor device of claim 2, wherein the guard ring is configured to receive a second supply voltage provided by a second power source for biasing the guard ring, the first and second supply voltages being different from one another so that the guard ring and the semiconductor body layer are biased to different potentials.

5. The power semiconductor device of claim 1, wherein the power semiconductor device comprises a control device for an inductive power element.

6. The device of claim 1, wherein the well of the first conductivity type is electrically insulated from the semiconductor substrate using a buried layer.

7. A power semiconductor device comprising:
 a semiconductor body layer extending over a semiconductor substrate of a first conductivity type, the semiconductor body layer having a second conductivity type opposite the first conductivity type;
 a first well of the first conductivity type formed in the semiconductor body layer, the first well and the semiconductor body layer forming a PN junction;
 at least one transistor formed in the first well;
 a first electrode region of the second conductivity type formed in the semiconductor body layer, wherein the first electrode region is laterally spaced from the first well and electrically connected to a first power source for biasing the semiconductor body layer; and
 a guard ring region of the first conductivity type comprising a second well of the first conductivity type, the guard ring region being disposed between the first electrode region and the first well and surrounding the first well, the guard ring region further comprising a second electrode region of the first conductivity type within the second well, the second electrode region being electrically connected to a second power source for biasing the guard ring region, the second power source being different from the first power source, wherein the guard ring region is laterally separated from the first well by the semiconductor body layer.

8. The power semiconductor device of claim 7, wherein the first conductivity type is P type, and the second conductivity type is N type, and the at least one transistor is an n-channel transistor.

9. The power semiconductor device of claim 7, wherein the semiconductor body layer comprises an epitaxial layer.

10. The power semiconductor device of claim 7, wherein one of the first and second power sources is electrically connected to a reference node of an external circuit.

11. The power semiconductor device of claim 7, further comprising a bulk electrode region of the first conductivity type formed in the first well, wherein the bulk electrode region is laterally spaced from the transistor and electrically connected to a third power source for biasing the first well.

12. The power semiconductor device of claim 11, wherein the bulk electrode region comprises a high-concentration impurity region of the first conductivity type and a low-concentration impurity region of the first conductivity type formed below the high-concentration impurity region.

13. The power semiconductor device of claim 12, wherein the bulk electrode region further comprises a deep impurity region of the first conductivity type extending from the high-concentration impurity region toward the semiconductor substrate through the low-concentration impurity region.

14. The power semiconductor device of claim 7, wherein the first electrode region comprises a high-concentration impurity region of the second conductivity type formed in an upper portion of the semiconductor body layer.

15. The power semiconductor device of claim 14, wherein the first electrode region further comprises a low-concentration impurity region of the second conductivity type formed below the high-concentration impurity region.

16. The power semiconductor device of claim 7, wherein the second electrode region comprises a high-concentration impurity region of the first conductivity type formed in an upper portion of the second well and a low-concentration impurity region of the first conductivity type formed below the high-concentration impurity region.

17. The power semiconductor device of claim 16, wherein the second electrode region further comprises a deep impurity region of the first conductivity type extending from the high-concentration impurity region toward the semiconductor substrate through the low-concentration impurity region.

18. The power semiconductor device of claim 7, further comprising a buried layer between the semiconductor substrate and the semiconductor body layer to electrically isolate the semiconductor substrate and the semiconductor body layer from one another.

19. The power semiconductor device of claim 18, wherein the buried layer is of the second conductivity type.

20. The power semiconductor device of claim 19, wherein the first well and the guard ring region directly contact the buried layer.

21. The power semiconductor device of claim 19, wherein the buried layer forms a PN junction with each of the semiconductor substrate, the first well, and the guard ring region.

22. The power semiconductor device of claim 7, wherein the power semiconductor device is a power control device for driving a motor.

23. A method of forming a power semiconductor device, the method comprising:
 forming a semiconductor structure comprising a semiconductor substrate of a first conductivity type, a buried layer of a second conductivity type opposite the first conductivity type over the substrate, and a semiconductor body layer of the second conductivity type over the buried layer;
 forming first and second wells of the first conductivity type in the semiconductor body layer, each the first and second wells forming a PN junction with the buried layer, the second well surrounding the first well but being laterally separated from the first well by the semiconductor body layer; and
 forming at least one transistor in the first well, the transistor comprising a source, drain, and a gate, the source comprising a first high-concentration impurity region formed in the first well and the drain comprising a second high-concentration impurity region formed in the first well;
 wherein the second well forms part of a guard ring region which together with the semiconductor substrate and the semiconductor body layer form a parasitic bipolar transistor, and the second well functions as a collector of the parasitic bipolar transistor.

24. The method of claim 23, further comprising:
 forming a first electrode region of the second conductivity type extending in the semiconductor body layer, the first electrode region being configured to receive a first power source for biasing the semiconductor body layer.

25. The method of claim 24, wherein the second well is formed to extend between the first well and the first electrode region so as to laterally isolate the well and the first electrode region from one another.

26. The method of claim 24, wherein the second well is configured to be biased by a second power source, the first and second power sources being different from one another so that the second well and the semiconductor body layer can be biased to different potentials.

27. The method of claim 23, wherein the buried layer electrically insulates the first well from the semiconductor substrate.

* * * * *